United States Patent
Neumeister et al.

(10) Patent No.: US 11,148,505 B2
(45) Date of Patent: Oct. 19, 2021

(54) TEMPERATURE CONTROL LAYER

(71) Applicant: Mahle International GmbH, Stuttgart (DE)

(72) Inventors: Dirk Neumeister, Stuttgart (DE); Achim Wiebelt, Neustadt (DE)

(73) Assignee: Mahle International GmbH

( * ) Notice: Subject to any disclaimer, the term of this patent is extended or adjusted under 35 U.S.C. 154(b) by 0 days.

(21) Appl. No.: 16/620,484

(22) PCT Filed: May 29, 2018

(86) PCT No.: PCT/EP2018/064101
§ 371 (c)(1),
(2) Date: Dec. 6, 2019

(87) PCT Pub. No.: WO2018/224361
PCT Pub. Date: Dec. 13, 2018

(65) Prior Publication Data
US 2020/0376930 A1     Dec. 3, 2020

(30) Foreign Application Priority Data
Jun. 8, 2017 (DE) .......................... 102017209680.2

(51) Int. Cl.
*B60H 1/22* (2006.01)
*B60H 1/00* (2006.01)
(Continued)

(52) U.S. Cl.
CPC ....... *B60H 1/2227* (2019.05); *B60H 1/00285* (2013.01); *B60H 1/00478* (2013.01);
(Continued)

(58) Field of Classification Search
CPC .............. B60H 1/2227; B60H 1/00478; B60H 1/00285; H01L 35/30; H01L 35/32;
(Continued)

(56) References Cited

U.S. PATENT DOCUMENTS 3,040,538 A * 6/1962 Alsing .................... F24F 13/22
                                                            62/3.2
3,197,342 A * 7/1965 Neild, Jr. ............... H01L 35/32
                                                            136/210
(Continued)

FOREIGN PATENT DOCUMENTS

CN         1492295 A      4/2004
CN       101932475 A     12/2010
(Continued)

OTHER PUBLICATIONS

English abstract for JP-H-2234836.
(Continued)

*Primary Examiner* — Emmanuel E Duke
(74) *Attorney, Agent, or Firm* — Fishman Stewart PLLC

(57) ABSTRACT

A temperature control layer, for example for an interior trim of a vehicle or a vehicle part is disclosed. The temperature control layer includes an areal thermoelectrical temperature control arrangement with at least one thermoelectrical element and an air extraction arrangement with at least one air extraction duct. The at least one air extraction duct leads from an outside of the temperature control layer through the temperature control arrangement to an inside of the temperature control layer.

20 Claims, 1 Drawing Sheet

(51) Int. Cl.
*B60N 2/56* (2006.01)
*B60N 2/58* (2006.01)
*F24F 5/00* (2006.01)
*H01L 35/30* (2006.01)
*H01L 35/32* (2006.01)

(52) U.S. Cl.
CPC ............ *B60N 2/5628* (2013.01); *B60N 2/58* (2013.01); *F24F 5/0042* (2013.01); *H01L 35/30* (2013.01); *H01L 35/32* (2013.01)

(58) Field of Classification Search
CPC ......... H01L 35/34; H01L 35/02; H01L 35/10; H01L 35/325; B60N 2/58; B60N 2/5628; F24F 5/0042; A41D 13/0025
See application file for complete search history.

(56) References Cited

U.S. PATENT DOCUMENTS

| | | | | |
|---|---|---|---|---|
| 4,065,936 | A * | 1/1978 | Fenton | F25B 21/02 62/3.3 |
| 5,924,766 | A * | 7/1999 | Esaki | B60N 2/5657 297/180.13 |
| 6,213,198 | B1 * | 4/2001 | Shikata | B60H 1/00478 165/202 |
| 6,291,803 | B1 | 9/2001 | Fourrey | |
| 7,461,892 | B2 * | 12/2008 | Bajic | A47C 7/72 297/180.1 |
| 8,359,871 | B2 * | 1/2013 | Woods | F25B 21/02 62/3.2 |
| 2006/0254284 | A1 * | 11/2006 | Ito | B60N 2/5692 62/3.3 |
| 2007/0193279 | A1 * | 8/2007 | Yoneno | B60N 2/5692 62/3.3 |
| 2007/0234742 | A1 * | 10/2007 | Aoki | B60N 2/5657 62/3.3 |
| 2011/0017421 | A1 * | 1/2011 | Esaki | B60N 2/5825 165/41 |
| 2011/0041246 | A1 * | 2/2011 | Li | A47C 31/006 5/421 |
| 2014/0165608 | A1 * | 6/2014 | Tseng | A47C 7/746 62/3.6 |
| 2016/0304013 | A1 | 10/2016 | Wolas et al. | |
| 2016/0361968 | A1 * | 12/2016 | Bell | B60H 1/00271 |
| 2017/0021694 | A1 * | 1/2017 | Oh | B60H 1/00385 |
| 2017/0354190 | A1 * | 12/2017 | Cauchy | B60N 2/5678 |
| 2018/0212132 | A1 * | 7/2018 | Yoon | H01L 35/32 |

FOREIGN PATENT DOCUMENTS

| | | |
|---|---|---|
| DE | 10 2012019650 A1 | 4/2013 |
| DE | 112014005563 T5 | 11/2016 |
| JP | H-2234836 A | 9/1990 |
| WO | WO-2015171901 A1 * | 11/2015 ........... B60N 2/5642 |

OTHER PUBLICATIONS

English abstract for DE-10 2012019650A1.
Chinese Office Action and Search Report dated Jul. 2, 2020 related to corresponding Chinese Patent Application No. 201880037680.0.

* cited by examiner

TEMPERATURE CONTROL LAYER

CROSS-REFERENCE TO RELATED APPLICATIONS

This application claims priority to International Patent App. No. PCT/EP2018/064101 filed on May 29, 2018 and to German App. No. DE 10 2017 209 680.2 filed on Jun. 8, 2017, the contents of each of which is hereby incorporated by reference in their entirety.

TECHNICAL FIELD

The invention relates to a temperature control layer in particular for an interior trim of a vehicle or of a vehicle part.

BACKGROUND

Temperature control layers for heating and/or for cooling an interior trim in a vehicle—such as for example a trim of the seats, of the arm rests or of the door inner surfaces—are already known. Besides a conventional resistance heating, a thermoelectrical temperature control arrangement can also be used in a conventional temperature control layer, which thermoelectrical temperature control arrangement thermo- electrically heats or cools the interior trim by way of the Peltier effect.

However, the conventional temperature control layers have a low energy efficiency and consequently a low heating or cooling output. An adequate heating or cooling output is only achieved with a substantial energy consumption, which in a vehicle is connected to a high fuel consumption and consequently to high costs.

SUMMARY

The object of the invention therefore is to provide a temperature control layer with a planar thermoelectrical temperature control arrangement with which the energy efficiency is increased.

According to the invention, this object is solved through the subject of the independent claim(s). Advantageous embodiments are subject of the dependent claims.

The present invention is based on the general idea of increasing the energy efficiency of a temperature control layer by increasing the heat exchange between the temperature control layer and the vehicle interior in a vehicle. For heating and for cooling the vehicle interior, the temperature control layer comprises a planar thermoelectrical temperature control arrangement with at least one thermoelectrical element. According to the invention, the temperature control layer comprises an air extraction arrangement with at least one air extraction duct, wherein the air extraction duct leads from an outside of the temperature control layer through the temperature control arrangement to an inside of the temperature control layer and extends transversely through the at least one thermoelectrical element.

The thermoelectrical element of the temperature control arrangement utilises the Peltier effect and can be employed both for the cooling and also for the heating of the interior trim and thereby of the vehicle interior in the vehicle. A change-over between the cooling and the heating can be easily effected by reversing the current direction in the thermoelectrical element. The air extraction duct of the extraction arrangement connects the outside and the inside of the temperature control layer, wherein the outside of the temperature control layer is defined as a side of the temperature control layer facing the vehicle interior. The respective air extraction duct according to the invention leads from an outside of the temperature control layer through the temperature control arrangement to an inside of the temperature control layer and also penetrates the thermoelectrical element of the temperature control arrangement. By way of the air extraction duct, the interior air can flow out from the outside of the temperature control layer, as a result of which the temperature differential between the thermoelectrical element and the vehicle interior is increased at least on the air extraction duct. An increase of the temperature differential leads to an increase of the heat exchange between the thermoelectrical element and the vehicle interior, as a result of which the vehicle interior is more efficiently heated or cooled. Consequently the energy efficiency of the thermoelectrical element and of the temperature control layer increases as a whole.

The interior trim of the vehicle or of the vehicle part can be for example a seat cover, an arm rest, an instrument panel, a roof lining, a cab floor, a door inner surface or a centre console surface. The number and the diameter of the air extraction ducts in the air extraction arrangement can vary dependent on the type of the interior trim and on the required heating or cooling output of the temperature control layer.

Advantageously it is provided that during the cooling the respective thermoelectrical element with a cooling surface faces the outside of the temperature control layer and the respective air extraction duct during the extracting of the interior air from the outside to the inside forms a heat sink. With such an arrangement of the thermoelectrical element, the vehicle interior is cooled on the outside of the temperature control layer by the thermoelectrical element. A heating surface of the thermoelectrical element faces the inside of the temperature control layer. The interior air is at least partly sucked into the air extraction duct and has a lower temperature than the heating surface of the thermoelectrical element. The air extraction duct, in conjunction with the cooler interior air that is present in the air extraction duct forms a heat sink within the temperature control layer. Between the drawn-in cooler interior air and the hotter heating surface a conductive or a convective heat exchange takes place and the heating surface of the thermoelectrical element is cooled. Since a temperature differential between the heating surface and the cooling surface of the thermoelectrical element depends on its physical properties and tends towards a constant value, the cooling side is cooled further. The heat exchange between the vehicle interior and the thermoelectrical element on the outside of the temperature control layer and altogether the cooling output of the temperature control layer increase. Furthermore, the cooling surface forms a planar radiation surface facing the passenger interior which because of the heat sink effectively cools the vehicle interior.

Alternatively or additionally it is provided that during the heating the respective thermoelectrical element with the heating surface faces the outside of the temperature control layer and the respective air extraction duct during the extraction of the interior air from the outside to the inside forms a heat source. With such an arrangement of the thermoelectrical element, the vehicle interior is heated on the outside of the temperature control layer and the cooling surface faces the inside of the temperature control layer. Here, the interior air is also drawn into the air extraction duct and has a higher temperature than the cooling surface of the thermoelectrical element. In conjunction with the interior air present in the air extraction duct, the air extraction duct forms a heat source within the temperature control layer. The cooling surface of the thermoelectrical element is heated through a conductive or a convective heat exchange. The temperature differential between the heating surface and the cooling surface of the thermoelectrical element becomes smaller as a result of which the temperature of the heating surface increases further. The heat exchange between the heating surface of the thermoelectrical element and the vehicle interior on the outside of the temperature control layer increases, as a result of which the heating output of the thermoelectrical element and of the temperature control layer as a whole increases. Furthermore, the heating surface forms an area radiation surface facing the passenger interior, which because of the heat source effectively heats the vehicle interior.

Both the heating output and also the cooling output of the thermoelectrical element and consequently of the temperature control layer can be increased in this way, as a result of which the energy efficiency of the temperature control layer as a whole increases.

Advantageously it is provided that the air extraction duct of the air extraction arrangement is an air void. The air voids can already be introduced into the temperature control arrangement during the production of the temperature control layer and form an air extraction arrangement. In this way, the expenditure for producing individual air extraction ducts can be reduced.

In a further development of the temperature control layer according to the invention it is provided that the temperature control layer comprises a heat transfer structure. There, the heat transfer structure on the inside of the temperature control layer connects the respective thermoelectrical elements of the temperature control arrangement with the respective air extraction ducts of the air extraction arrangement in a heat-conductive manner. Here, the heat transfer structure can be produced for example from a heat-conductive material—for example from a metal or from a metal alloy—and cover the temperature control layer completely or in certain regions. The heat transfer structure can be arranged lying against the temperature control arrangement facing the inside of the temperature control layer. By way of the heat transfer structure, the heat exchange between the heating surface or the cooling surface of the respective thermoelectrical elements and of the heat source or of the heat sink of the respective air extraction ducts can be increased as a result of which the energy efficiency of the temperature control layer can also be increased.

In order to further increase the heat exchange between the heating surface or the cooling surface of the respective thermoelectrical elements and the heat source or the heat sink of the respective air extraction ducts it is provided that the heat transfer structure is fixed on an inner surface of the respective air extraction duct at least in certain regions. In this way, a direct heat exchange between the interior air present in the air extraction duct and the heat transfer structure and consequently the respective thermoelectrical elements can be achieved, as a result of which the heating output or the cooling output of the respective thermoelectrical elements can be increased. Advantageously, the heat transfer structure can form the interior surface of the air extraction duct at least in certain regions, so that the heat exchange can be further improved.

Advantageously it is provided that the temperature control layer on the inside has a transfer layer which is fixed to the temperature control arrangement or the heat transfer structure. The transfer layer can be fixed for example on the heat transfer structure or directly on the thermoelectrical elements in a firmly bonded manner. The transfer layer can be both heat-conductive and also heat-insulating and for example form an internal padding for the interior trim. Here, the air extraction ducts of the air extraction structure pass through the transfer layer where they can be formed for example by air voids.

In order to be able to extract the interior air through the air extraction ducts of the air extraction arrangement it is advantageously provided that the temperature control layer comprises an extraction device. By way of the extraction device—for example an air pump—the interior air can be extracted through the air extraction ducts of the air extraction arrangement from an outside of the temperature control layer through the temperature control arrangement to the inside of the temperature control layer. Through the extraction device, the heat exchange between the vehicle interior and the temperature control layer can be regulated in that the output of the extraction device and thus the quantity of the extracted interior air is adapted dependent on the required cooling or heating output of the temperature control layer.

Altogether, the temperature control layer according to the invention has a better cooling and heating output and a higher energy efficiency compared with the conventional temperature control layers. Altogether, the fuel consumption in a vehicle can thereby be reduced and the environment protected.

The invention also relates to an interior trim for a vehicle or for a vehicle part, wherein according to the invention the interior trim comprises a temperature control layer as described above. The interior trim can be for example a seat cover, an arm rest, an instrument panel, a roof lining, a cab floor, a door interior surface or a centre console surface. Through the interior trim with the temperature control layer according to the invention, the cooling and the heating output can be significantly increased and the energy efficiency improved.

Further important features and advantages of the invention are obtained from the subclaims, from the drawings and from the associated figure description by way of the drawings.

It is to be understood that the features mentioned above and still to be explained in the following cannot only be used in the respective combination stated but also in other combinations or by themselves without leaving the scope of the present invention.

Preferred exemplary embodiments of the invention are shown in the drawings and are explained in more detail in the following description, wherein same reference numbers relate to same or similar or functionally same components.

BRIEF DESCRIPTION OF THE DRAWINGS

It shows, in each case schematically

DETAILED DESCRIPTION

Figure 1:
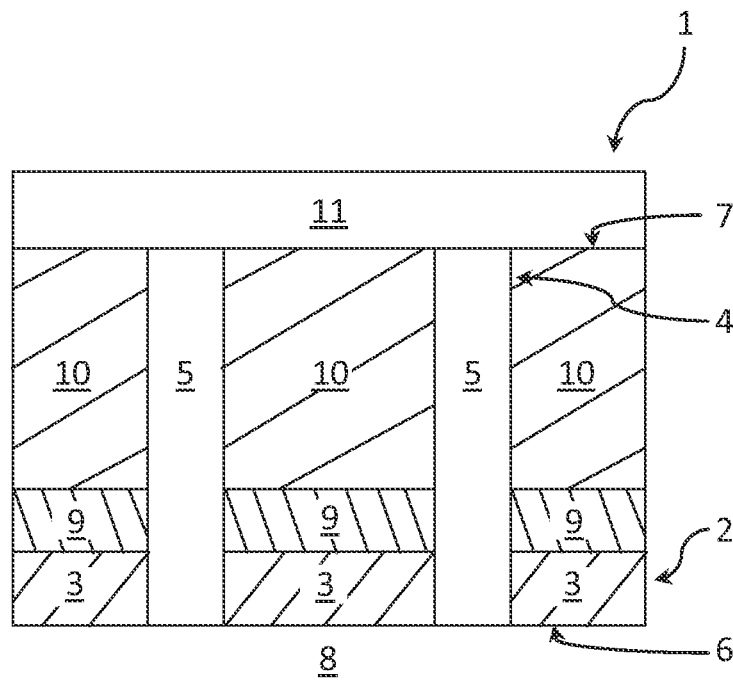
FIG. 1 a sectional view of a temperature control layer according to the invention.

FIG. 1 shows a schematic sectional view of a temperature control layer 1 according to the invention for an interior trim of a vehicle or of a vehicle part. The interior trim can be for example a seat cover, an arm rest, an instrument panel, a roof lining, a cab floor, a door inner surface, a centre console or similar. The temperature control layer 1 comprises a planar thermoelectrical temperature control arrangement 2 with a thermoelectrical element 3. According to the invention, the temperature control layer 1 comprises an air extraction arrangement 4 with air extraction ducts 5, wherein the respective air extraction duct 5 leads from an outside 6 of the temperature control layer 1 through the temperature control arrangement 2 to an inside 7 of the temperature control layer 1. The outside 6 of the temperature control layer 1 is defined as a side of the temperature control layer 1 facing a vehicle interior 8.

The thermoelectrical element 3 of the temperature control arrangement 2 in this case is a Peltier element and can be used both for the cooling and also for the heating of the vehicle interior 8. Through the respective air extraction duct 5, the interior air can flow from the outside 6 of the temperature control layer 1 through to the inside 7 of the temperature control layer 1, as a result of which the temperature differential between the thermoelectrical element 3 and the vehicle interior 8 increases at least on the air extraction duct 5. This leads to an increase of the heat exchange between the thermoelectrical element 3 and the vehicle interior 8, as a result of which the vehicle interior 8 is more efficiently heated or cooled. The number and the diameter of the air extraction ducts 5 in the air extraction arrangement 4 can vary dependent on the type of the interior trim and on the required cooling or heating output.

Furthermore, the temperature control layer 1 comprises a heat transfer structure 9. The heat transfer structure 9 faces the inside 7 of the temperature control layer 1 and is arranged lying against the temperature control arrangement 2. The heat transfer structure 9 connects the thermoelectrical element 3 with the air extraction ducts 5 in a heat-conductive manner. The heat transfer structure 9 can be produced for example from a metal or a metal alloy and cover the temperature control arrangement 2 completely or in certain regions. In this exemplary embodiment, the heat transfer structure 9 forms an inner surface of the air extraction ducts 5 in certain regions.

On the heat transfer structure 9 a transfer layer 10 is arranged lying against the same, which forms an internal padding for the interior trim. The air extraction ducts 5 of the air extraction structure 4 pass through the transfer layer 10 and can be formed for example by air voids in the transfer layer 10. The temperature control layer 1 also comprises an extraction device 11 through which the interior air can be extracted through the air extraction ducts 5 of the air extraction arrangement 4 from the outside 6 through the temperature control arrangement 2 to the inside 7—for example with an air pump.

Figure 2:
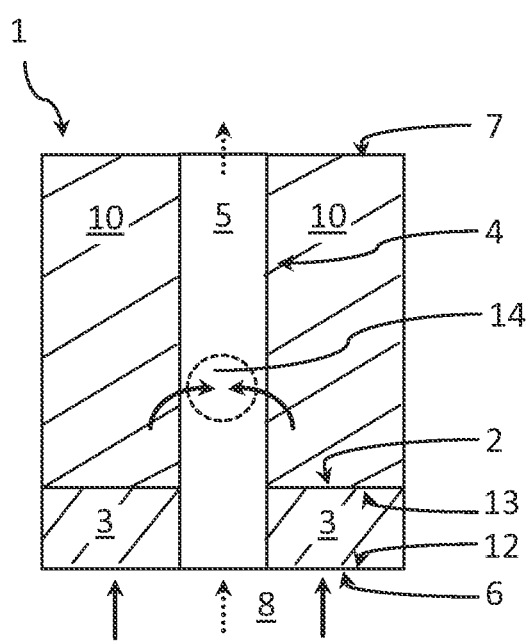
FIG. 2 a sectional view of a temperature control layer according to the invention during a cooling operation.

FIG. 2 shows a schematic sectional view of the temperature control layer 1 according to the invention during cooling. For the sake of clarity, the heat transport is indicated here with continuous arrows and the air transport with dotted arrows. The thermoelectrical element 3 faces the outside 6 of the temperature control layer 1 with a cooling surface 12 and the inside 7 of the temperature control layer 1 with a heating surface 13. On the outside 6 of the temperature control layer 1, the vehicle interior 8 is cooled through the thermoelectrical element 3 and the interior air is at least partly drawn into the air extraction duct 5. The interior air in the air extraction duct 5 has a lower temperature than the heating surface 13 of the thermoelectrical element 3 and the extraction duct 5, in conjunction with the interior air, forms a heat sink 14. Between the drawn-in cooler interior air and the hotter heating surface 13 a conductive or a convective heat exchange takes place and the heating surface 13 of the thermoelectrical element 3 is cooled. Consequently, the cooling surface 12 of the thermoelectrical element 3 is cooled further. The heat exchange between the vehicle interior and the thermoelectrical element 3 on the outside 6 of the temperature control layer 1 and consequently the cooling output of the thermoelectrical element 3 increase.

Figure 3:
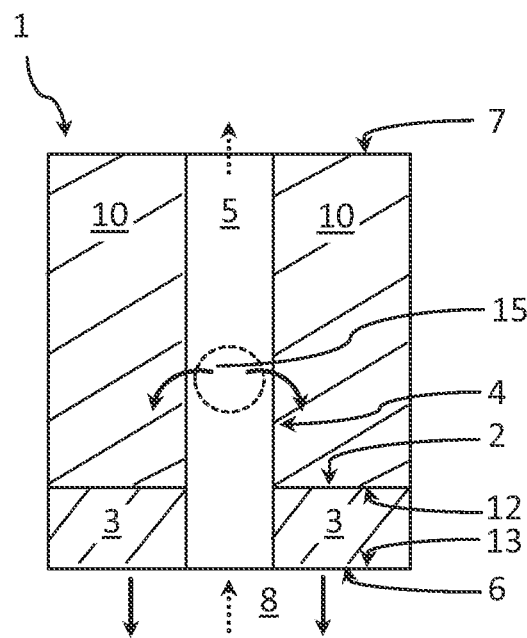
FIG. 3 a sectional view of a temperature control layer according to the invention during a heating operation.

FIG. 3 shows a schematic sectional view of the temperature control layer 1 according to the invention during heating. Here, too, the heat transport is indicated with continuous arrows and the air transport with dotted arrows for the sake of clarity. Here, the heating surface 13 faces the outside 6 of the temperature control layer 1 and the cooling surface 12 faces the inside 7 of the temperature control layer 1. Such a deviating arrangement of the cooling surface and the heating surface in the thermoelectrical element 3 is easily possible by a reversal of the current direction. The vehicle interior 8 is heated on the outside 6 of the temperature control layer 1 and the interior air is at least partly drawn into the air extraction duct 5. The drawn-in interior air has a higher temperature than the cooling surface 12 of the thermoelectrical element 3 and the air extraction duct 5, in conjunction with the interior air that is present in the air extraction duct 5, forms a heat source 15. The cooling surface 12 of the thermoelectrical element 3 is heated through a conductive or a convective heat exchange. The temperature differential between the heating surface 13 and the cooling surface 12 of the thermoelectrical element 3 becomes smaller, as a result of which the temperature of the heating surface 13 increases further. The heat exchange between the heating surface 13 of the thermoelectrical element 3 and the vehicle interior 8 increases as a result of which the heating output of the thermoelectrical element 3 increases.

In the temperature control layer 1 according to the invention, both the heating output and also the cooling output of the thermoelectrical element 3 and consequently of the temperature control layer 1 as a whole can be increased. Altogether, the temperature control layer 1 according to the invention has a higher energy efficiency compared with the conventional temperature control layers.

The invention claimed is:

1. A temperature control layer of a vehicle, comprising:
   a planar thermoelectrical temperature control arrangement with at least one thermoelectrical element;
   an air extraction arrangement with at least one air extraction duct that leads from an outside of the temperature control layer through the temperature control arrangement to an inside of the temperature control layer; and
   wherein the at least one air extraction duct extends transversely through the at least one thermoelectrical element.

2. The temperature control layer according to claim 1, wherein during a cooling of a vehicle interior, the at least one thermoelectrical element faces the outside of the temperature control layer with a cooling surface and the inside of the temperature control layer with a heating surface, and the at least one air extraction duct in conjunction with interior air extracted from the outside to the inside provides a heat sink.

3. The temperature control layer according to claim 1, wherein during a heating of a vehicle interior, the at least one thermoelectrical element faces the outside of the temperature control layer with a heating surface and the inside of the temperature control layer with a cooling surface, and the at least one air extraction duct in conjunction with interior air extracted from the outside to the inside provides a heat source.

4. The temperature control layer according to claim 1, wherein the at least one air extraction duct of the air extraction arrangement is an air void that penetrates through the at least one thermoelectrical element.

5. The temperature control according to claim 1, further comprising a heat transfer structure which on the inside of the temperature control layer connects the at least one thermoelectrical element of the temperature control arrangement with the at least one air extraction duct of the air extraction arrangement in a heat-conductive manner.

6. The temperature control layer according to claim 5, wherein the heat transfer structure is fixed on an inner surface of the at least one air extraction duct in at least one region.

7. The temperature control layer according to claim 5, further comprising a transfer layer disposed on the inside, structured and arranged to connect the heat transfer structure and the air extraction arrangement.

8. The temperature control layer according to claim 1, further comprising a transfer layer disposed on the inside, structured and arranged to connect the temperature control arrangement and the air extraction arrangement.

9. The temperature control layer according to claim 1, further comprising an extraction device through which interior air is extractable through the at least one air extraction duct of the air extraction arrangement from the outside of the temperature control layer through the temperature control arrangement to the inside of the temperature control layer.

10. The temperature control layer according to claim 9, wherein the extraction device comprises an air pump.

11. The temperature control layer according to claim 1, wherein the at least one thermoelectrical element is a Peltier element.

12. An interior trim for a vehicle or for a vehicle part, comprising:
a temperature control layer, the temperature control layer including:
a planar thermoelectrical temperature control arrangement with at least one thermoelectrical element;
an air extraction arrangement with at least one air extraction duct that leads from an outside of the temperature control layer that faces a vehicle interior through the temperature control arrangement to an inside of the temperature control layer; and
wherein the at least one air extraction duct extends transversely through the at least one thermoelectrical element.

13. The interior trim according to claim 12, wherein the interior trim is a seat cover, an arm rest, an instrument panel, a roof lining, a cab floor, a door interior surface or a centre console surface.

14. The interior trim according to claim 12, wherein during a cooling of the vehicle interior, the at least one thermoelectrical element faces the outside of the temperature control layer with a cooling surface and the at least one air extraction duct in conjunction with interior air extracted from the outside to the inside provides a heat sink.

15. The interior trim according to claim 12, wherein during a heating of the vehicle interior, the at least one thermoelectrical element faces the outside of the temperature control layer with a heating surface and the at least one air extraction duct in conjunction with interior air extracted from the outside to the inside provides a heat source.

16. The interior trim according to claim 12, wherein the at least one air extraction duct is an air void.

17. The interior trim according to claim 12, wherein the temperature control layer further includes a heat transfer structure lying against the temperature control arrangement on an inner side of the at least one thermoelectrical element, wherein the heat transfer structure connects the at least one thermoelectrical element with the at least one air extraction duct in a heat-conductive manner on the inside of the temperature control layer, and wherein the at least one air extraction duct extends transversely to the at least one thermoelectrical element and the heat transfer structure.

18. The interior trim according to claim 17, wherein the heat transfer structure is composed of a metal or a metal alloy and fixed on an inner surface of the at least one air extraction duct in at least one region.

19. The interior trim according to claim 17, wherein the temperature control layer further includes a transfer layer lying against the heat transfer structure on the inside, structured and arranged to connect the temperature control arrangement and the air extraction arrangement.

20. The interior trim according to claim 12, wherein the temperature control layer further includes an extraction device through which interior air is extracted via the at least one air extraction duct.

* * * * *